(12) United States Patent
Hayashi et al.

(10) Patent No.: US 11,895,785 B2
(45) Date of Patent: Feb. 6, 2024

(54) DISPLAY DEVICE ATTACHMENT STRUCTURE, DISPLAY DEVICE, AND DISPLAY DEVICE ATTACHMENT STRUCTURE ATTACHING METHOD

(71) Applicant: Funai Electric Co., Ltd., Osaka (JP)

(72) Inventors: Takumi Hayashi, Osaka (JP); Tetsuo Nishidate, Osaka (JP)

(73) Assignee: FUNAI ELECTRIC CO., LTD., Osaka (JP)

( * ) Notice: Subject to any disclaimer, the term of this patent is extended or adjusted under 35 U.S.C. 154(b) by 0 days.

(21) Appl. No.: 17/708,418

(22) Filed: Mar. 30, 2022

(65) Prior Publication Data
US 2022/0346246 A1    Oct. 27, 2022

(30) Foreign Application Priority Data
Apr. 26, 2021    (JP) ................. 2021-074277

(51) Int. Cl.
*H05K 5/00* (2006.01)
*H05K 5/02* (2006.01)
*F16M 13/02* (2006.01)

(52) U.S. Cl.
CPC ........... *H05K 5/0204* (2013.01); *F16M 13/02* (2013.01); *H05K 5/0017* (2013.01)

(58) Field of Classification Search
None
See application file for complete search history.

(56) References Cited

U.S. PATENT DOCUMENTS

| | | | | |
|---|---|---|---|---|
| 11,089,697 | B2* | 8/2021 | Takahashi | G09F 9/30 |
| 2015/0359337 | A1* | 12/2015 | Bliven | F16M 13/02 |
| | | | | 361/679.01 |
| 2016/0135305 | A1* | 5/2016 | Shin | H05K 5/0017 |
| | | | | 361/759 |
| 2016/0295717 | A1* | 10/2016 | Kim | G09F 9/30 |
| 2017/0064851 | A1* | 3/2017 | Shin | H05K 5/0226 |
| 2017/0318694 | A1* | 11/2017 | Yun | H05K 5/0017 |
| 2019/0223303 | A1* | 7/2019 | Chang | F16M 11/22 |
| 2019/0327842 | A1* | 10/2019 | Ryu | G06F 1/183 |

FOREIGN PATENT DOCUMENTS

JP    2018-148373 A    9/2018

\* cited by examiner

*Primary Examiner* — Xanthia C Relford
*Assistant Examiner* — Xanthia C Cunningham
(74) *Attorney, Agent, or Firm* — Global IP Counselors, LLP (57) ABSTRACT

A display device attachment structure comprises a plate member configured to be attached to a rear housing of a display device and to which a component of the display device is configured to be attached, a fastening member attached to the plate member for fixing the plate member to a back surface of the rear housing opposite a display surface of the display device via a fastening hole, and a fixing member attached to the plate member for fixing the plate member to the back surface of the rear housing, the fixing member being a different type of fastener than the fastening member.

19 Claims, 9 Drawing Sheets

DISPLAY DEVICE ATTACHMENT STRUCTURE, DISPLAY DEVICE, AND DISPLAY DEVICE ATTACHMENT STRUCTURE ATTACHING METHOD

CROSS-REFERENCE TO RELATED APPLICATIONS

This application claims priority to Japanese Patent Application No. 2021-74277 filed in Japan on Apr. 26, 2021. The entire disclosure of Japanese Patent Application No. 2021-74277 is hereby incorporated herein by reference.

BACKGROUND

Field of the Invention

This invention generally relates to a display device attachment structure, a display device, and a display device attachment structure attaching method. More specifically, this invention relates to a display device attachment structure, a display device, and a display device attachment structure attaching method for attaching a component to a rear housing.

Background Information

Conventionally, attachment structures for display devices are known for attaching components, such as speakers, to a rear housing (see, for example, Japanese Laid-Open Patent Application Publication No. 2018-148373 (Patent Document 1)).

The above Patent Document 1 discloses a display device with a display, a front cover surrounding the display, a rear cover attached to the front cover, and a speaker screwed to the rear cover.

SUMMARY

Although not disclosed in the above Patent Document 1, a display device may be configured by screwing components (speakers) to a rear housing of a display panel consisting of ready-made display and rear cover. However, some display panels may not have fastening holes for attaching the components, so it is necessary to provide new fastening holes for attaching the components. Also, depending on the display panel, the positions of the pre-provisioned fastening holes and the positions of fastening holes on the components may not match, requiring work to newly provide fastening holes for attaching the components. Therefore, it is difficult to improve the workability of attaching the components on the rear housing, and there is a need to improve the workability of attaching the components.

One object of this disclosure is to provide a display device attachment structure, a display device, and a display device attachment structure attaching method, which can improve workability for attaching a component.

In view of the state of the known technology, a display device attachment structure according to a first aspect of this disclosure comprises a plate member configured to be attached to a rear housing of a display device and to which a component of the display device is configured to be attached, a fastening member attached to the plate member for fixing the plate member to a back surface of the rear housing opposite a display surface of the display device via a fastening hole, and a fixing member attached to the plate member for fixing the plate member to the back surface of the rear housing, the fixing member being a different type of fastener than the fastening member.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the art from this disclosure that the following descriptions of the embodiments are provided for illustration only and not for the purpose of limiting the invention as defined by the appended claims and their equivalents.

First Embodiment (Configuration of Display Device)

Referring to FIGS. 1A to 6, the configuration of a display device 100 according to a first embodiment of the present disclosure will be described. The display device 100 includes, for example, an OLED display (Organic Light Emitting Diode display, Organic EL display), a liquid crystal display device, etc. The following is an example where the display device 100 is an organic EL display.

Figure 1A:
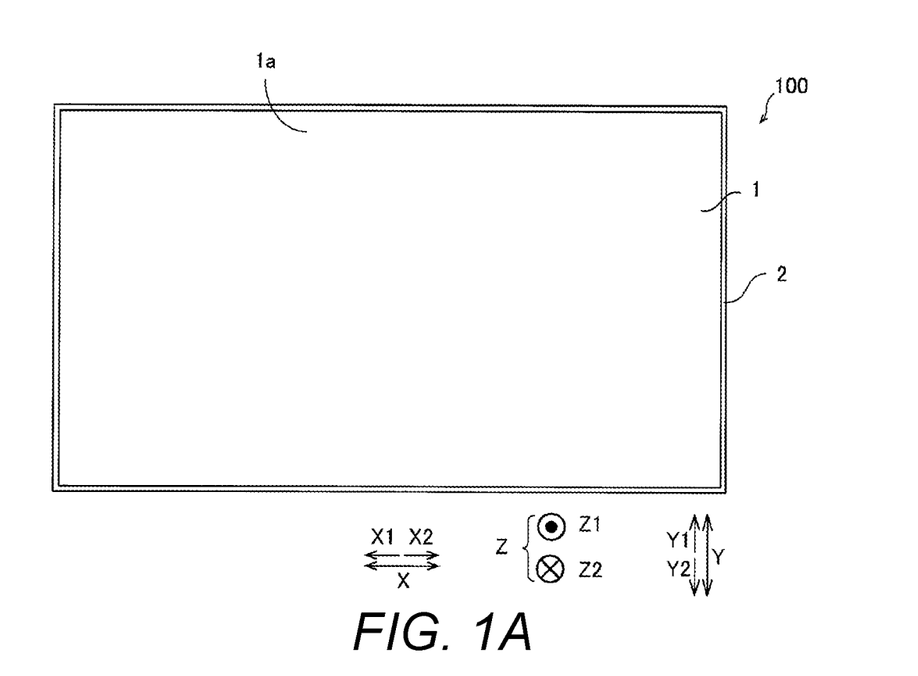
FIGS. 1A and 1B are diagrams of a display device, with FIG. 1A being a front elevational view from a front side, and FIG. 1B being a rear elevational view from a rear side.
Figure 1B:
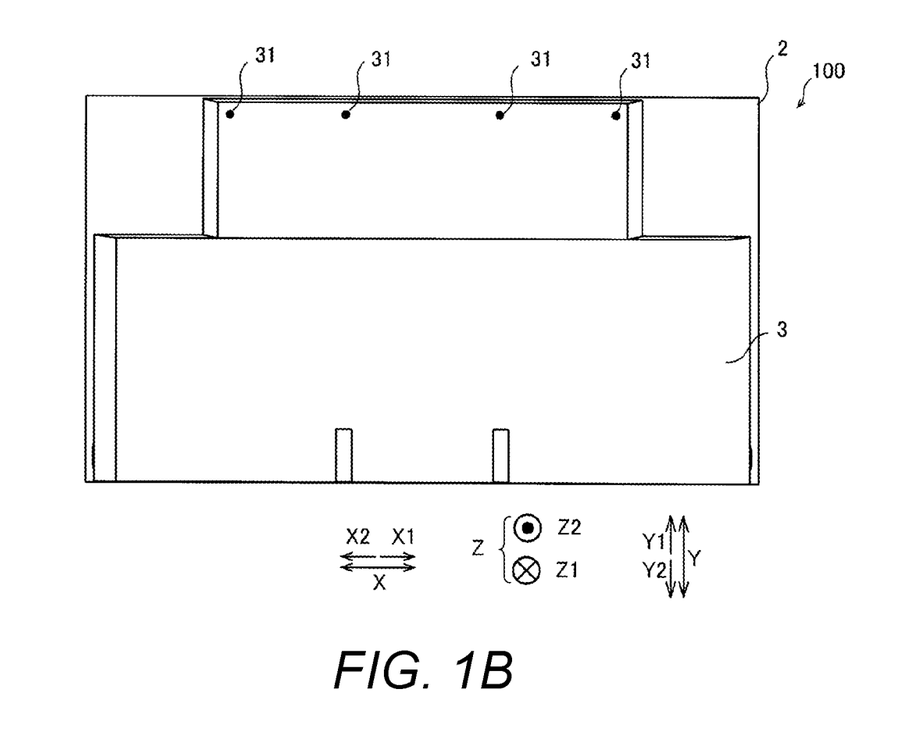
Figure 2:
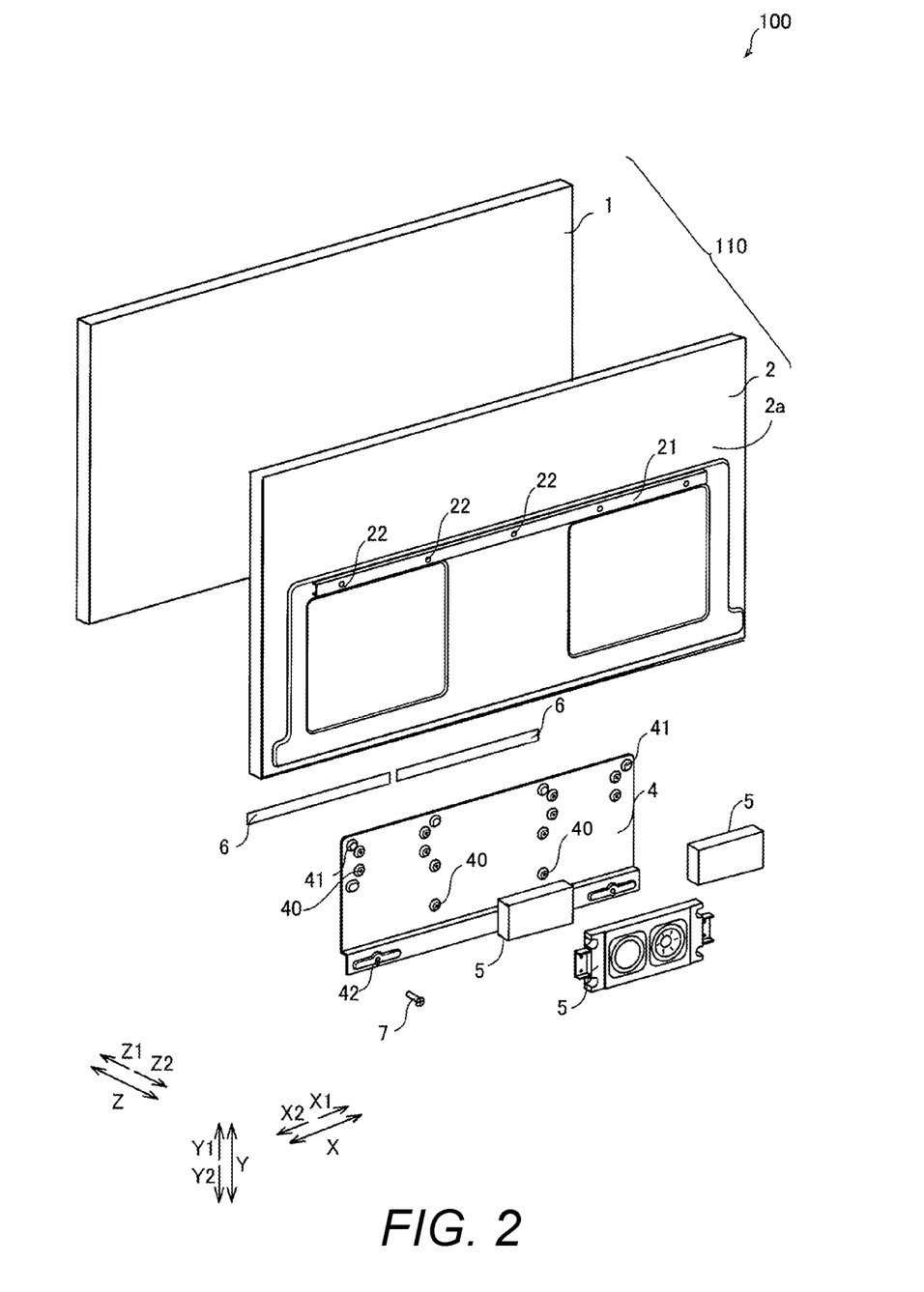
FIG. 2 is an exploded perspective view of the display device.

As shown in FIGS. 1A, 1B and 2, the display device 100 according to the first embodiment comprises a display 1, a rear housing 2, a cover member 3, and a plate member 4. The display 1, the rear housing 2, and the cover member 3 are collectively referred to as a display panel 110. In the first embodiment, the plate member 4 is attached to a ready-made display panel 110. In FIG. 2, the cover member 3 is omitted.

The display 1 includes a plurality of LEDs (light emitting diodes), and an image is displayed by emitting light from the plurality of LEDs. The display 1 is driven based on video signals. Display 1 is rectangular in shape. A display surface 1$a$ side is referred to as a front side (Z1 side), and the opposite side of the Z1 side is referred to as a rear side (Z2 side). Furthermore, a thickness direction of the display 1 connecting the front side and the rear side is referred to as a Z direction. Also, a long or longitudinal direction (a left-right direction) of the display 1 orthogonal to the Z direction is referred to as an X direction, and a short direction (an up-down direction) of the display 1 orthogonal to the Z direction is referred to as a Y direction. In the X direction, the left side as viewed from the front side to the rear side is referred to as an X1 side, and the right side is referred to as an X2 side. In the Y direction, an upper end side of the display 1 is referred to as a Y1 side and the lower end side is referred to as a Y2 side.

As shown in FIG. 1B), the rear housing 2 is rectangular. The rear housing 2 is made of sheet metal. The rear housing 2 is attached to the display 1 from the rear side (the Z2 side) that is opposite the display surface 1a of the display 1 (see FIG. 1A). The length of the rear housing 2 in the up-down direction (the Y direction) is greater than the length of the display 1 in the up-down direction (the Y direction). The length of the rear housing 2 in the left-right direction (the X direction) is greater than the length of the display 1 in the left-right direction (the X direction). Therefore, an inner surface of the rear housing 2 is fixed to an outer surface of the display 1 in a contact manner.

As shown in FIG. 2, a beam 21 is provided to a back surface 2a side (the Z2 side) of the rear housing 2. The beam 21 is provided to protrude from the rear housing 2. The beam 21 is provided separately from the rear housing 2. The beam 21 is made of sheet metal. The beam 21 is provided near the center of the rear housing 2 in the up-down direction (the Y direction). The beam 21 is formed to extend in the left-right direction (the X direction) of the rear housing 2. The beam 21 is provided to reinforce the rear housing 2. The beam 21 is provided with attachment holes for attaching other components at the time the display panel 110 is manufactured. The beam 21 is fixedly coupled to the back surface 2a of the rear housing 2 by a suitable fastening means, such as screws, adhesive, etc. The sheet metal forming the beam 21 can be thicker than the sheet metal forming the rear housing 2, for example.

As shown in FIG. 2, the plate member 4 is formed of planar sheet metal. The plate member 4 is attached to the back surface 2a (a surface on the Z2 side) of the rear housing 2. Components 5 of the display device 100 are attached to the rear side (the Z2 side) of the plate member 4. The plate member 4 is attached to an upper portion of the rear housing 2. The plate member 4 is a smaller member than the rear housing 2. The length of the plate member 4 in the longitudinal direction (the X direction) is smaller than the length of the beam 21 in the longitudinal direction (the X direction). The detailed configuration of the plate member 4 will be described below.

As shown in FIG. 1B, the cover member 3 is made of resin. The cover member 3 is made of polystyrene, for example. The cover member 3 is attached to the plate member 4 (see FIG. 2) so as to cover the plate member 4. The cover member 3 is attached to the plate member 4 with screws 31. The cover member 3 is attached so as to cover a part of the rear housing 2.

(Detailed Configuration of Plate Member)

Figure 4:
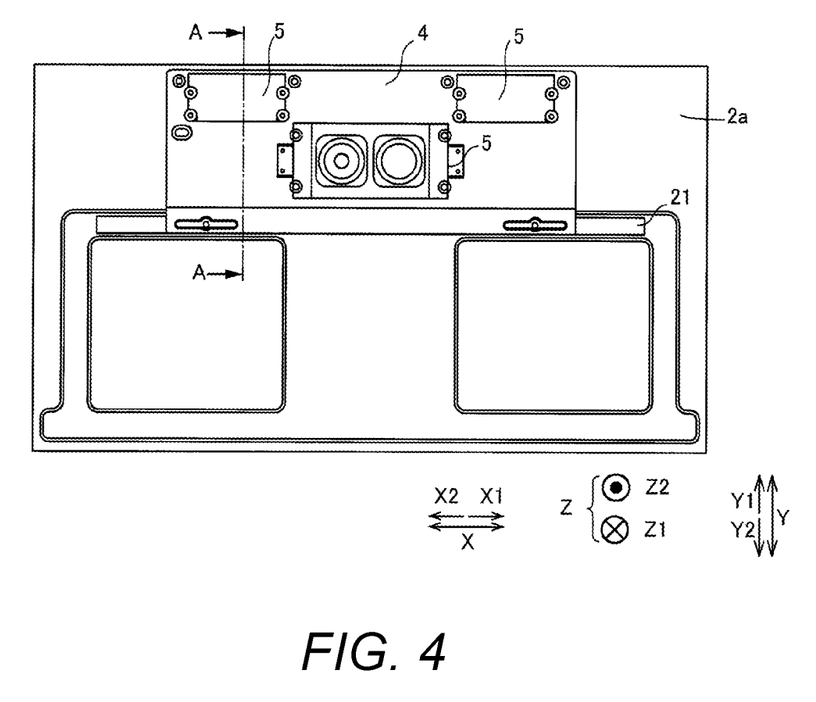
FIG. 4 is a diagram showing a state in which a component is attached to the plate member.

As shown in FIG. 4, the plate member 4 is configured such that the components 5 are attached to the rear side (the Z2 side) of the plate member 4. The components 5 are parts for performing the functions of the display device 100 (see FIGS. 1A and 1B), and include, for example, acoustic parts and memory parts. The components 5 are, for example, speakers.

Figure 3:
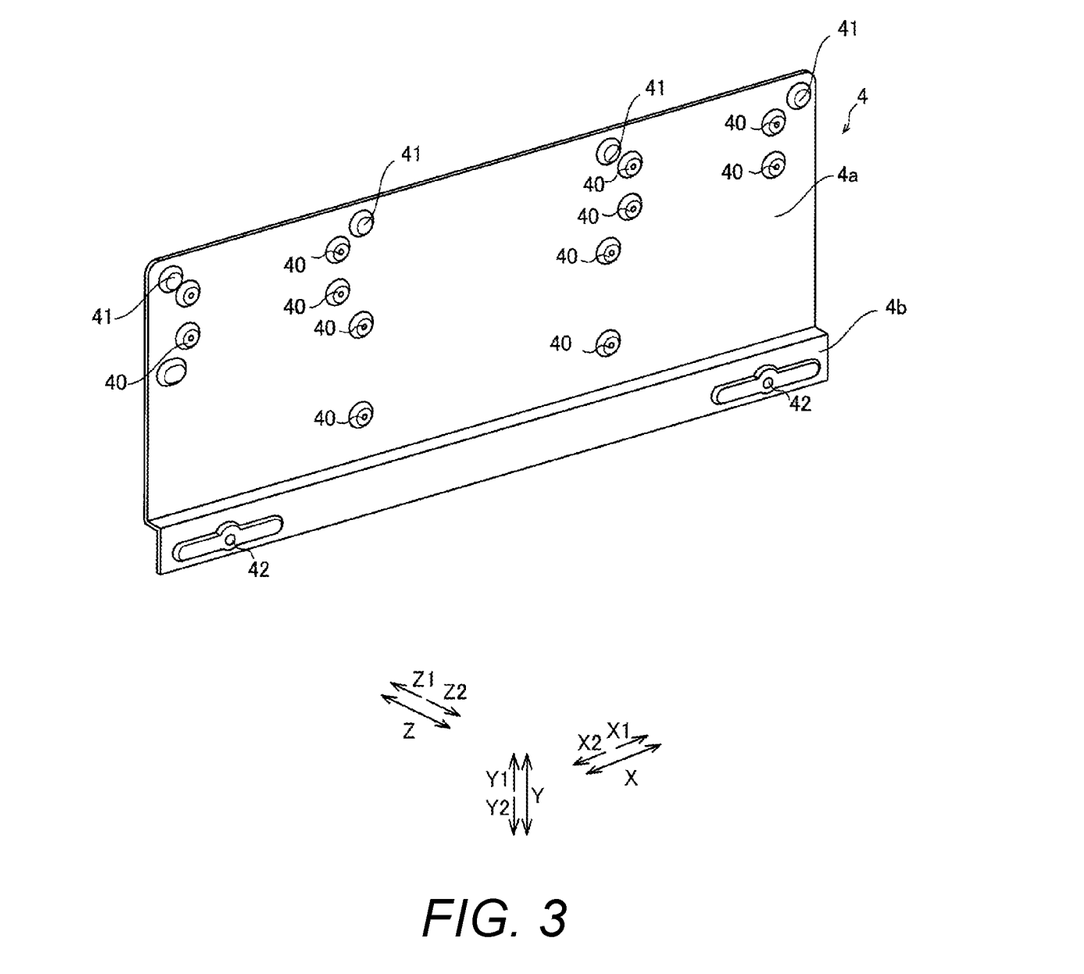
FIG. 3 is a perspective view of a plate member according to a first embodiment.

As shown in FIG. 3, the plate member 4 has a plurality of component attachment portions 40 for attaching the components 5 (see FIG. 2). Specifically, the plate member 4 includes the component attachment portions 40 to which the components 5 of the display device 100 are attached. The component attachment portions 40 are fastening holes that penetrate through the plate member 4 from the front side (the Z1 side) to the rear side (the Z2 side). The component attachment portions 40 are provided according to the positions of the fastening holes of the components 5 that is to be attached. In the illustrated embodiment, the component attachment portions 40 are threaded holes to which screws that are inserted into the fastening holes of the components 5 are threadedly coupled. With this configuration, the components 5 can be directly and fixedly coupled to the plate member 4 using the screws.

The plate member 4 includes a plurality of cover member attachment portions 41 to which the cover member 3 (see FIG. 1B) is fixed. The cover member attachment portions 41 are fastening holes that penetrate through the plate member 4 from the front side (the Z1 side) to the rear side (the Z2 side). The cover member attachment portions 41 are provided at the upper end of the plate member 4. The positions of the cover member attachment portions 41 are closer to the upper end side (the Z1 side) of the plate member 4 than the component attachment portions 40. A plurality of the cover member attachment portions 41 are provided. In the illustrated embodiment, the cover member attachment portions 41 are threaded holes to which the screws 31 are threadedly coupled. With this configuration, the cover member 3 can be directly and fixedly coupled to the plate member 4 using the screws 31.

Figure 5:
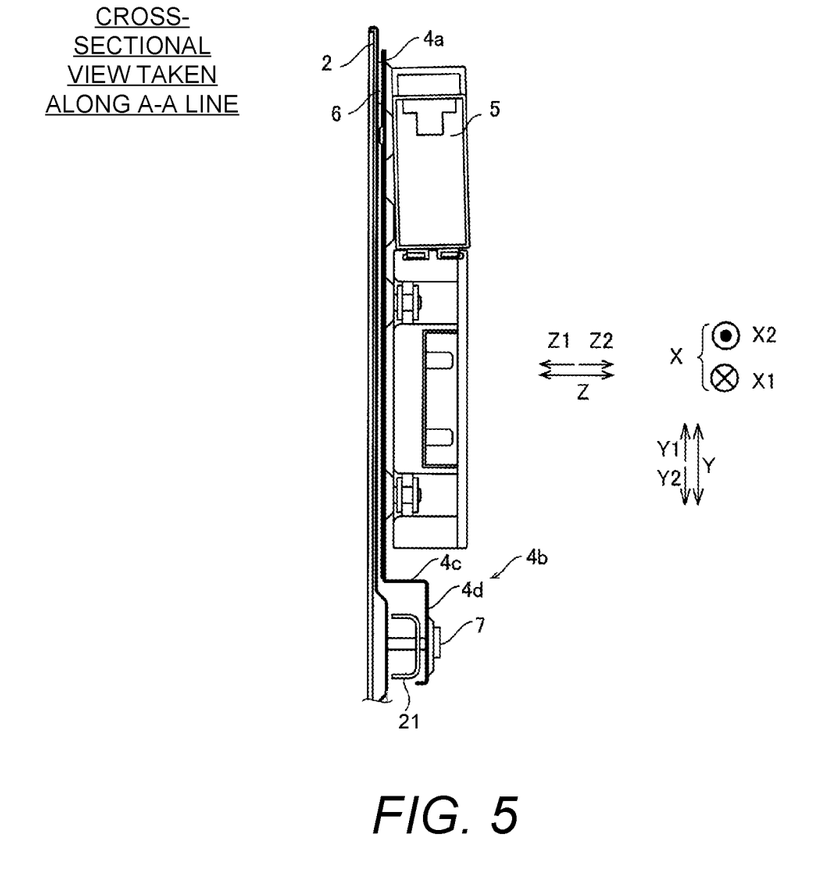
FIG. 5 is a cross-sectional view taken along A-A line of FIG. 4.

As shown in FIG. 5, the plate member 4 has a flat portion 4a and a protruding portion 4. The flat portion 4a is substantially parallel to the back surface 2a of the rear housing 2. The protruding portion 4b is bent relative to the flat portion and protrudes toward the rear side (the Z2 side) of the plate member 4 along the beam 21. The flat portion 4a is attached to a position above the beam 21 of the rear housing 2. The protruding portion 4b includes a first portion 4c that extends toward the rear side (the Z2 side) of the plate member 4 from the boundary relative to the flat portion 4a along the beam 21, and a second portion 4d that extends downward (the Z2 side) from the boundary relative to the first portion 4c along the beam 21. The second portion 4d is provided parallel to the back surface 2a of the rear housing 2.

Figure 6:
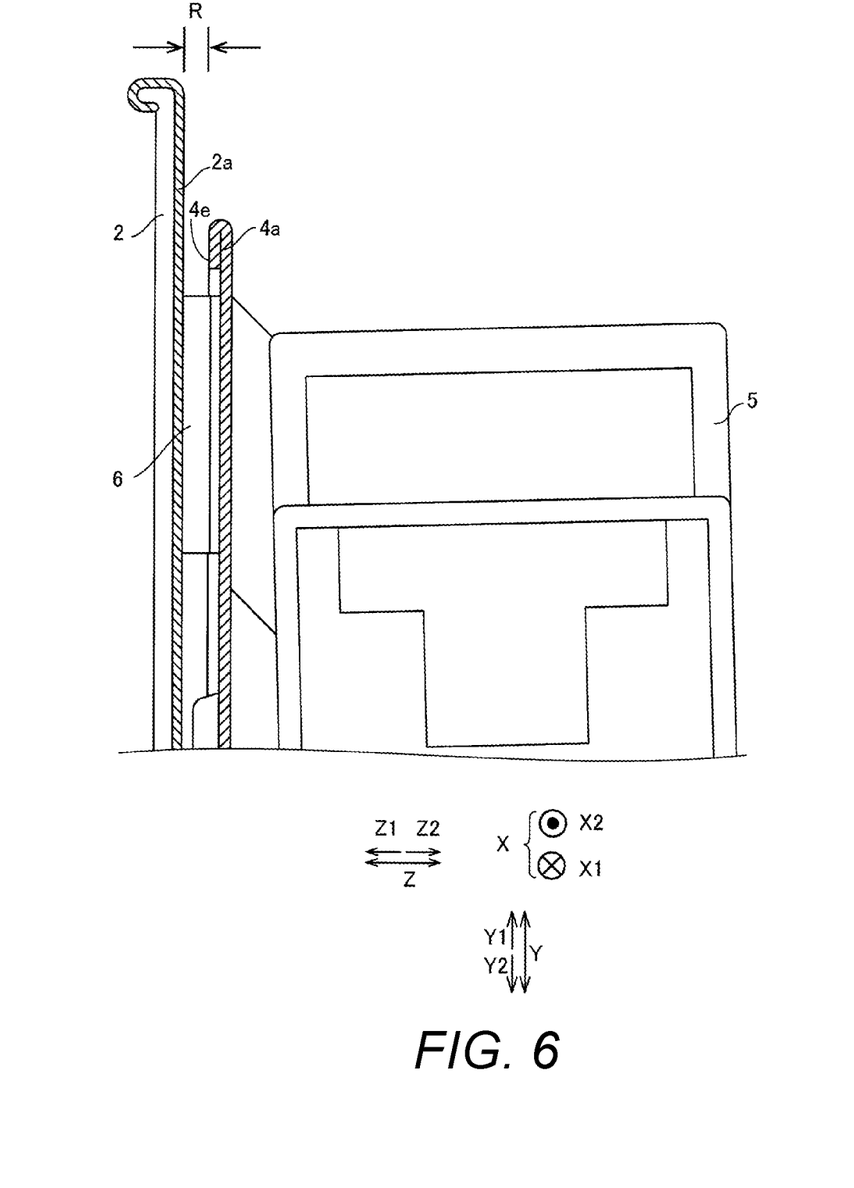
FIG. 6 is an enlarged partial view showing a state in which the plate member is attached to a rear housing.

As shown in FIGS. 2 and 6, a plurality of (two in FIG. 2) planar permanent magnets 6 and a plurality of (only one is shown in FIG. 2) bolts or screws 7 are attached to the plate member 4. The permanent magnets 6 are used to fix the plate member 4 to the back surface 2a of the rear housing 2 without using fastening holes and fastening members. The permanent magnets 6 are arranged to extend along the longitudinal direction (the X direction) of the plate member 4. The permanent magnets 6 may be one or more than one, but in the first embodiment, two are provided. The permanent magnets 6 are attached to an upper portion, preferably to an upper end, of the plate member 4 using adhesive sheets. The permanent magnets 6 are also attached to the rear housing 2 by magnetic force. The permanent magnets 6 are provided between the back surface 2a (the surface on the Z2 side) of the rear housing 2 and a front surface 4e (a surface on the Z1 side) of the flat portion 4a of the plate member 4, and attached to the back surface 2a (the surface on the Z2 side) of the rear housing 2 and the front surface 4e (the surface on the Z1 side) of the flat portion 4a of the plate member 4. The permanent magnets 6 are an example of a "fixing member" or a "non-fastening type fixing member" of the present disclosure, and the bolts 7 are an example of a "fastening member" of the present disclosure. Furthermore, in the illustrated embodiment, a structure formed by the plate member 4, the permanent magnets 6, the bolts 7 and the beam 21 is a "display device attachment structure" of the present disclosure. In the illustrated embodiment, the bolts or screws 7 are a threaded fastener, while the permanent magnets 6 are a magnetic fastener, which is a different type of fastener than the bolt or screws 7. Furthermore, the "fastening member" and the "fixing member" for fixing the plate member 4 to the back surface 2a of the rear housing 2 are not limited to the bolts 7 and the permanent magnets 6. For example, in the illustrated embodiment, the "fastening member" can be any type of threaded fasteners, while the "fixing member" can be any type of fasteners other than or different from the threaded fasteners, such as unthreaded fasters, touch or hook-and-loop fasteners, adhesives (adhesive sheets or tapes), or magnetic, vacuum or friction fasteners. In the illustrated embodiment, the "fixing member" of the present disclosure is a fastener that can be provided to the plate member 4 or the rear housing 2 without requiring machining of the plate member 4 or the rear housing 2. However, the "fixing member" of the present disclosure can also be a fastener that requires machining of the plate member 4 or the rear housing 2 when the "fixing member" is a fastening structure integrated with the plate member 4 or the rear housing 2, such as a fastening structure having an engagement pawl and an engagement hole.

The bolts 7 are used to fix the plate member 4 to fastening holes 22 of the beam 21. Specifically, after aligning attachment holes 42 of the plate member 4 with the fastening holes 22 of the beam 21, the bolts 7 are inserted into the attachment holes 42 of the plate member 4 and the fastening holes 22 of the beam 21. A plurality of the bolts 7 are provided.

As shown in FIG. 3, the plate member 4 is provided with the attachment holes 42 for attaching the bolts 7. Specifically, the plate member 4 includes the attachment holes 42 through which the bolts 7 are disposed to be coupled to the fastening holes 22. The attachment holes 42 that are provided in the plate member 4 are provided at both ends of the plate member 4 in the longitudinal direction (the X direction) so as to fix both ends of the plate member 4. The attachment holes 42 are provided at the lower end of the plate member 4. The attachment holes 42 may be long holes. In the illustrated embodiment, the fastening holes 22 are threaded holes to which the bolts 7 are threadedly coupled, while the attachment holes 42 are unthreaded or through holes into which the bolts 7 are inserted. With this configuration, the plate member 4 can be directly and fixedly coupled to the beam 21 using the bolts 7.

As shown in FIGS. 5 and 6, the plate member 4 is fixed to the back surface 2a of the rear housing 2 by the permanent magnets 6 attached to the flat portion 4a. Also, the plate member 4 is fixed to the beam 21 by the bolts 7 at the protruding portion 4b.

As shown in FIGS. 5 and 6, the front surface 4e (the surface on the Z1 side) of the plate member 4 is attached to the back surface 2a of the rear housing 2a by the permanent magnets 6 and the bolts 7 in a state separated from the back surface 2a of the rear housing 2. Specifically, except for portions where the plate member 4 contacts the rear housing 2 via the permanent magnets 6 and a portion where the plate member 4 contacts the beam 21, the rear housing 2 and the plate member 4 are separated from each other without making contact. The surface of the plate member 4 that faces the back surface 2a of the rear housing 2 is separated from the back surface 2a of the rear housing 2 by the thickness R of the permanent magnets 6. The thickness R (the length in the Z direction) of the permanent magnets 6 is, for example, 3 mm or more.

(Display Device Attachment Structure Attaching Method)

Next, an attaching method (e.g., a display device attachment structure attaching method) will be explained using a case of attaching the plate member 4 and the components 5 to the ready-made display panel 110 as an example. The components 5 are attached to the back surface 2a (the surface on the Z2 side) of the plate member 4. The components 5 are screwed from the front side (the Z1 side) of the plate member 4 via the component attachment portions 40.

The plate member 4 to which the components 5 are attached is then attached to the rear housing 2 via the permanent magnets 6. The plate member 4 is then fixed to the beam 21 by the bolts 7. The cover member 3 is then attached to the plate member 4. The cover member 3 is screwed from the rear side.

(Effect of First Embodiment)

In the first embodiment, the following effects can be obtained.

In the first embodiment, as described above, the plate member 4 to which the components 5 of the display device 100 are attached, the permanent magnets 6 for fixing the plate member 4 to the back surface 2a of the rear housing 2 opposite the display surface 1a of the display device 100 without using a fastening hole and a fastening member, and the bolts 7 for fixing the plate member 4 to the back surface 2a of the rear housing 2 via the fastening holes 22 are provided. With this configuration, the plate member 4 can be attached to the rear housing 2 by the permanent magnets 6 without using a fastening hole and a fastening member, and thus the number of fastening holes to be newly provided in the rear housing 2 can be reduced. As a result, workability for attaching the components 5 can be improved.

In the first embodiment, as described above, the front surface 4e of the plate member 4 that faces the back surface 2a of the rear housing 2 is attached to the back surface 2a of the rear housing 2 in a state separated from the back surface 2a of the rear housing 2 by the permanent magnets 6 and the bolts 7. With this configuration, for example, when the vibration components 5, such as speakers, are attached to the plate member 4, the generation of sound when the plate member 4 and the rear housing 2 come into contact with each other due to the vibration of the speakers attached to the plate member 4 can be suppressed.

In the first embodiment, as described above, the fixing member or the non-fastening type fixing member includes the planar permanent magnets 6 or adhesive sheets. With this configuration, the planar permanent magnets 6 or the adhesive sheets can be used to attach the plate member 4 to the rear housing 2, and thus the number of fastening holes to be newly provided in the rear housing 2 can be reduced.

In the first embodiment, as described above, the beam 21 that protrudes toward the rear side is attached to the back surface 2a of the rear housing 2 to reinforce the rear housing 2, and the plate member 4 is configured to be fixed to the beam 21 by the bolts 7. With this configuration, by attaching the plate member 4 to the beam 21 that protrudes toward the rear side, the plate member 4 can be separated from the back surface 2a of the rear housing 2 by the amount that the beam 21 protrudes on the rear side 4.

In the first embodiment, as described above, the beam 21 is provided to extend along the longitudinal direction of the rear housing 2. With this configuration, the beam 21 is large enough to sufficiently reinforce the display device 100.

In the first embodiment, as described above, the plate member 4 has the flat portion 4a that is substantially parallel to the back surface 2a of the rear housing 2 and the protruding portion 4b that bends and protrudes toward the rear side along the beam 21, is fixed to the back surface 2a of the rear housing 2 by the planar permanent magnets 6 or adhesive sheets at the flat portion 4a, and is fixed to the beam 21 by the bolts 7 as fastening members at the protruding portion 4b. With this configuration, due to that the plate member 4 comprises the protruding portion 4b along the beam 21, the plate member 4 can be securely fixed along the beam 21. In addition, due to that the plate member 4 has the flat portion 4a, it becomes easier to attach the plate member 4 to the rear housing 2 via the planar permanent magnets 6 or adhesive sheets.

In the first embodiment, as described above, the front surface 4e of the plate member 4 that faces the back surface 2a of the rear housing 2 is configured to be separated from the back surface 2a of the rear housing 2 by the thickness R of the planar permanent magnets or adhesive sheets. With this configuration, the spacing between the rear housing 2 and the plate member 4 can be adjusted by adjusting the thickness R of the planar permanent magnets or the adhesive sheets.

In the first embodiment, the permanent magnets 6 are attached to one of the upper portion and the lower portion of the plate member 4 and the bolts 7 are attached to the other one of the upper portion and the lower portion of the plate member 4, as described above. With this configuration, the plate member 4 can be fixed to the rear housing 2 at two locations, the upper portion and the lower portion of the plate member 4, and thus the plate member 4 can be stably fixed.

In the first embodiment, the components 5 include speakers, as described above. With this configuration, since the speakers are attached to the plate member 4, there is no need to provide a fastening hole for attaching the speakers to the rear housing 2. As a result, workability for attaching the speaker can be improved.

In the first embodiment, as described above, the plate member 4 further includes the cover member attachment portions 41 to which the cover member 3 for covering the back surface of the display device 100 is fixed. With this configuration, the cover member 3 can be attached to the rear housing 2 without providing an attachment portion for attaching the cover member 3 to the back surface 2a of the rear housing 2.

In the first embodiment, as described above, the display device 100 comprises the plate member 4 to which the components 5 of the display device 100 are attached, the permanent magnets 6 for fixing the plate member 4 to the back surface 2a of the rear housing 2 opposite the display surface 1a of the display device 100 without using a fastening hole and a fastening member, and the bolts 7 for fixing the plate member 4 to the back surface 2a of the rear housing 2 via the fastening holes 22. With this configuration, the plate member 4 can be attached to the rear housing 2 without using a fastening hole and a fastening member, and thus the number of fastening holes to be newly provided in the rear housing 2 can be reduced. As a result, workability for attaching the components 5 can be improved.

In the first embodiment, as described above, the step of fixing the plate member 4 to which the components 5 are attached to the back surface 2a of the rear housing opposite the display surface 1a of the display device 100 by the permanent magnets 6 without using a fastening hole and a fastening member, and the step of fixing the plate member 4 to which the components 5 are attached to the back surface 2a of the rear housing 2 by the bolts 7 via the fastening holes 22. With this configuration, by fixing by the permanent magnets 6 without using a fastening hole and a fastening member, the number of fastening holes to be newly provided in the rear housing 2 can be reduced, and thus workability for attaching the components 5 can be improved.

Second Embodiment

Next, with reference to FIGS. 1A, 1B, 7 and 8, the configuration of the display device 100 according to a second embodiment will be described. In the second embodiment, unlike the first embodiment, a wall mount 8 (see FIG. 8) is attached to the plate member 4. The configuration of the second embodiment that is common to the first embodiment will be given the same reference numerals, and the descriptions thereof will be omitted.

Figure 7:
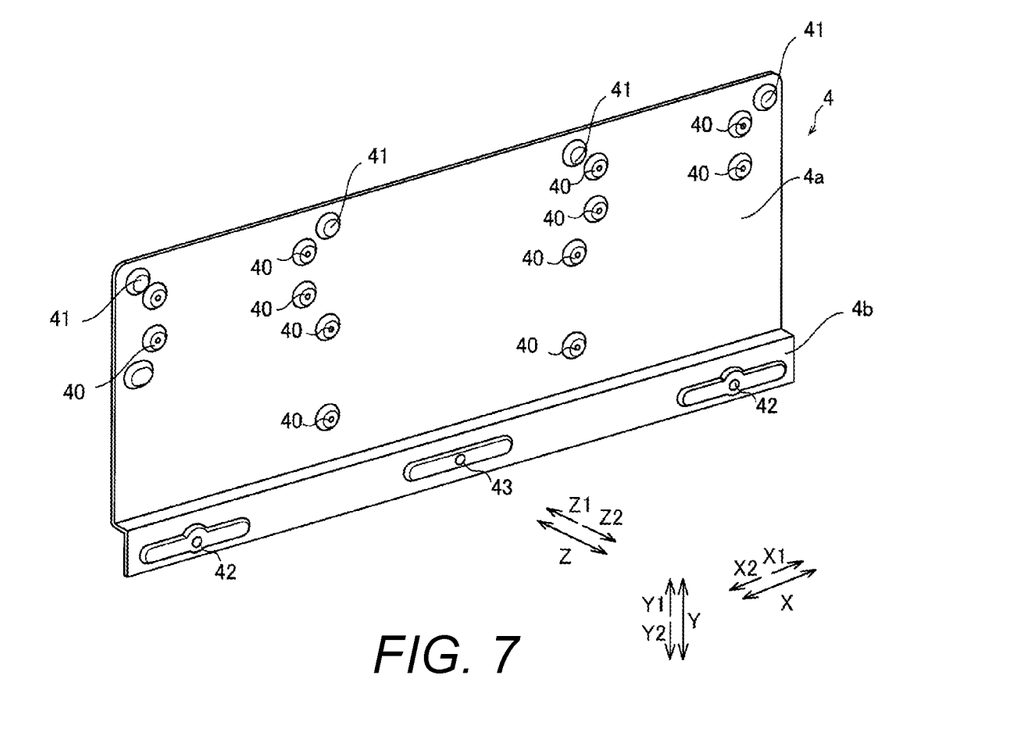
FIG. 7 is a perspective view of a plate member according to a second embodiment.

As shown in FIG. 7, the plate member 4 includes a wall mount attachment portion 43 to which the wall mount 8 (see FIG. 8) for mounting the display device 100 on a wall is attached. The wall mount attachment portion 43 is a screw or threaded hole. The wall mount attachment portion 43 is provided at the lower portion of the plate member 4. Specifically, in the illustrated embodiment, the wall mount attachment portion 43 is provided at the protruding portion 4b with the attachment holes 42.

Figure 8:
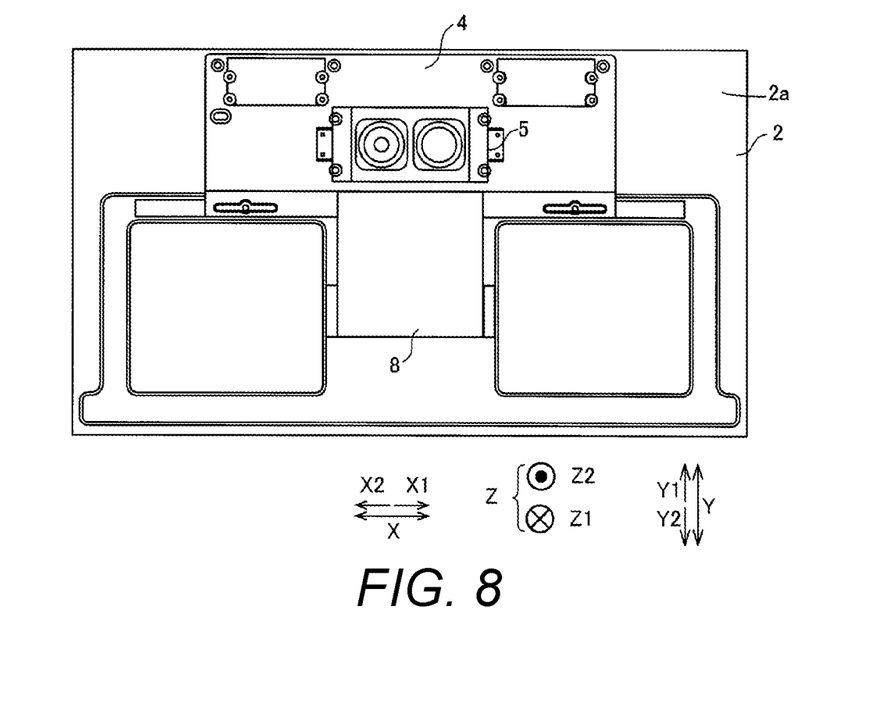
FIG. 8 is a diagram showing a state in which a wall mount is attached to a plate member.

As shown in FIG. 8, the wall mount 8 is attached after the plate member 4 is attached to the rear housing 2 of the display device 100. The wall mount 8 is, for example, a mounting plate manufactured in accordance with VESA (Video Electronics Standards Association) specification. The wall mount 8 is used by being connected to a fixed member attached to the wall.

Other components of the second embodiment are the same as the first embodiment above.
(Effect of Second Embodiment)

In the second embodiment, as in the first embodiment above, the plate member 4 to which the components 5 of the display device 100 are attached, the permanent magnets 6 for fixing the plate member 4 to the back surface 2a of the rear housing 2 opposite the display surface 1a of the display device 100 without using a fastening hole or a fastening member, and the bolts 7 for fixing the plate member 4 to the back surface 2a of the rear housing 2 the fastening holes 22 are provided. With this configuration, the plate member 4 can be attached to the rear housing 2 without using a fastening hole and a fastening member, and thus the number of fastening holes to be newly provided in the rear housing 2 can be reduced. As a result, workability for attaching the components 5 can be improved.

In the second embodiment, the plate member 4 further includes the wall mount attachment portion 43 to which the wall mount 8 for mounting the display device 100 on a wall is attached. With this configuration, the wall mount 8 can be attached without providing a fastening hole for attaching the wall mount 8 to the back surface 2a of the rear housing 2.

Other effects of the second embodiment are the same as the first embodiment.

Third Embodiment

Figure 9:
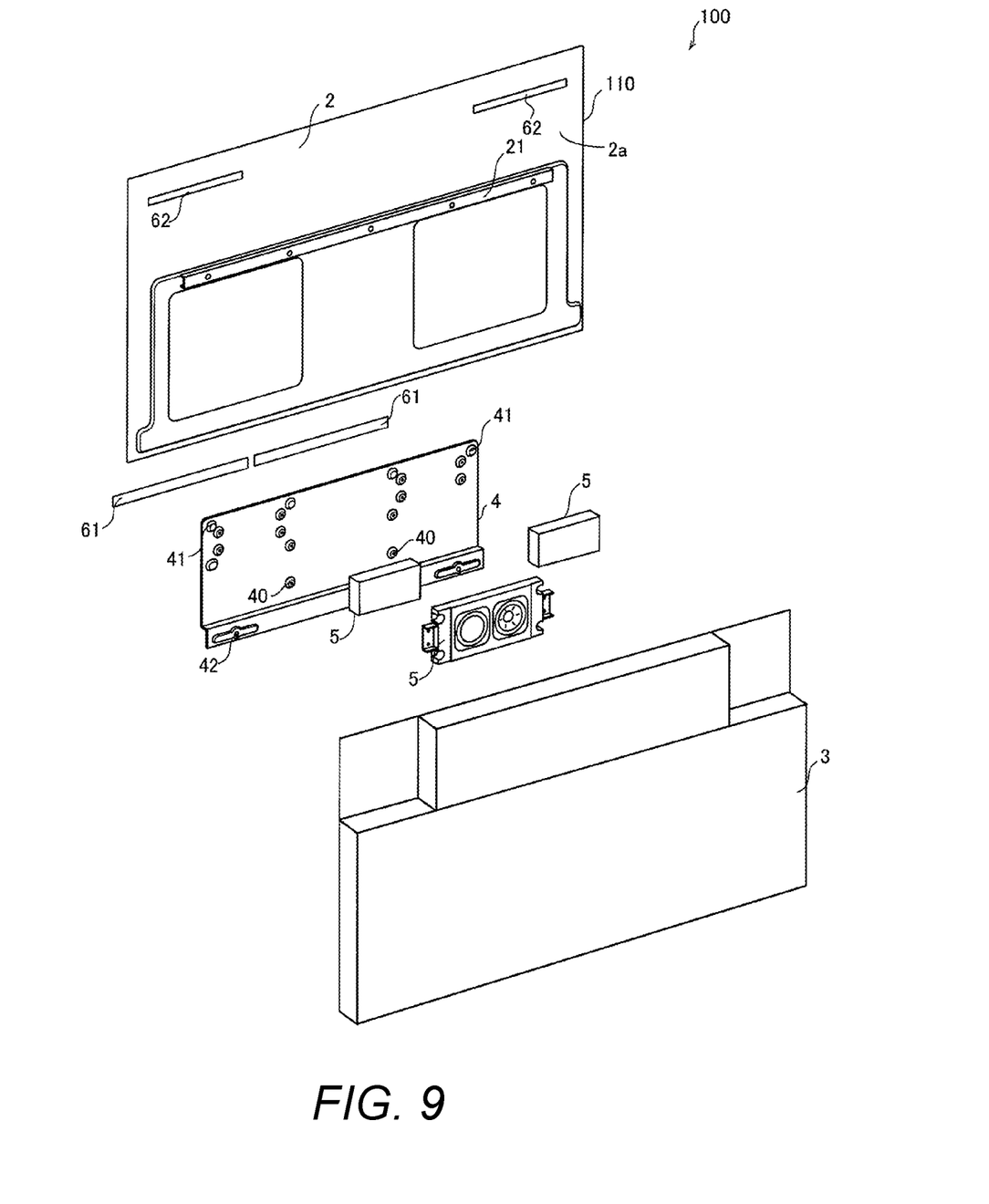
FIG. 9 is a diagram illustrating a non-fastening type fixing member according to a third embodiment.

Next, with reference to FIGS. 1A, 1B and 9, the configuration of the display device 100 according to a third embodiment is described. In the third embodiment, unlike the first embodiment, first double-sided tapes 61 (see FIG. 8) are used, instead of the permanent magnets 6, as a fixing member or a non-fastening type fixing member. The configuration of the third embodiment that is common to the first embodiment, will be given the same reference numerals, and the description thereof will be omitted. The first double-sided tapes are an example of an "adhesive sheet" as described in the claims.

As shown in FIG. 9, the plate member 4 is attached to the back surface 2a of the rear housing 2 by the first double-sided tapes 61. Specifically, the first double-sided tapes 61 are provided between the upper end of the front surface (the surface on the Z1 side) of the plate member 4 and the back surface 2a of the rear housing 2, and is attached to the upper end of the front surface (the surface on the Z1 side) of the plate member 4 and the back surface 2a of the rear housing 2. The first double-sided tapes 61 are provided at the upper end on the Z1 side relative to the component attachment portions 40.

The cover member 3 is attached to both the plate member 4 and the rear housing 2. The cover member 3 is attached to the back surface 2a of the rear housing 2 by second double-sided tapes 62. The second double-sided tapes 62 are also attached to the upper portion of the cover member 3. The second double-sided tapes 62 may be one or more than one, but in the third embodiment there are two. The cover member 3 covers the entire back surface 2a of the rear housing 2.

Other configurations of the third embodiment are the same as the first embodiment above.

(Effect of Third Embodiment)

In the third embodiment, as in the first embodiment above, the plate member 4 to which the components 5 of the display device 100 are attached, the permanent magnets 6 for fixing the plate member 4 to the back surface 2a of the rear housing 2 opposite the display surface 1a of the display device 100 without using a fastening hole or a fastening member, and the bolts 7 for fixing the plate member 4 to the back surface 2a of the rear housing 2 the fastening holes are provided. With this configuration, the plate member 4 can be attached to the rear housing 2 without using a fastening hole and a fastening member, and thus the number of fastening holes to be newly provided in the rear housing 2 can be reduced. As a result, workability for attaching the components 5 can be improved.

Other effects of the third embodiment are the same as the first embodiment.

MODIFICATION EXAMPLES

The embodiments disclosed here should be considered in all respects to be illustrative and not restrictive. The scope of the invention is indicated by the claims, not by the description of the embodiments described above, and furthermore includes all changes (modification examples) within the meaning and scope equivalent to the claims.

Figure 10:
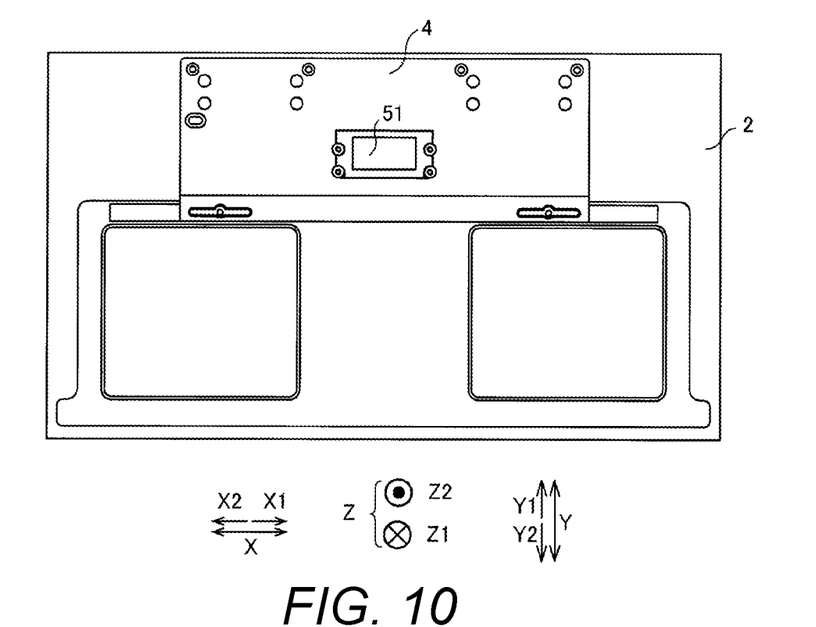
FIG. 10 is a diagram showing a state in which a component is attached to a plate member according to a modification example.

For example, with the first to third embodiments above, an example is shown in which the components are speakers, but this invention is not limited to this. For example, as shown in FIG. 10, the component may be a hard disk drive (HDD) 51.

Figure 11:
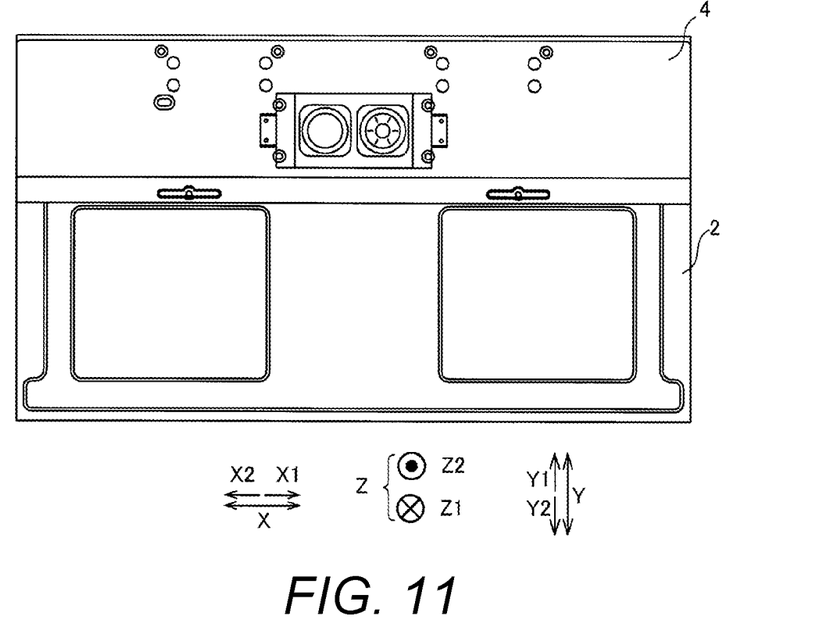
FIG. 11 is a diagram showing a state in which a plate member is attached to a rear housing according to a modification example.

With the first to third embodiments above, an example is shown in which the length of the plate member in the longitudinal direction is smaller than the length of the beam in the longitudinal direction, but this invention is not limited to this. For example, as shown in FIG. 11, the length of the plate member in the longitudinal direction can be greater than or equal to the length of the beam in the longitudinal direction.

With the first to third embodiments above, an example is shown in which the fastening member is the bolt, but this invention is not limited to this. For example, the fastening member can be a pin.

(1) In view of the state of the known technology, a display device attachment structure according to a first aspect of this disclosure comprises a plate member configured to be attached to a rear housing of a display device and to which a component of the display device is configured to be attached, a fastening member attached to the plate member for fixing the plate member to a back surface of the rear housing opposite a display surface of the display device via a fastening hole, and a fixing member attached to the plate member for fixing the plate member to the back surface of the rear housing, the fixing member being a different type of fastener than the fastening member.

The display device attachment structure according to the first aspect of this disclosure comprises the fixing member for fixing the plate member to the back surface of the rear housing. The fixing member is a different type of fastener than the fastening member, such as a non-fastening type fixing member for fixing the plate member to the back surface of the rear housing without using a fastening hole and a fastening member. With this configuration, the plate member can be attached to the rear housing by the non-fastening type fixing member without using a fastening hole and a fastening member, and thus the number of fastening holes to be newly provided in the rear housing can be reduced. As a result, workability for attaching the component can be improved.

(2) In accordance with a preferred embodiment according to the display device attachment structure mentioned above, a surface of the plate member that faces the back surface of the rear housing is attached to the back surface of the rear housing in a state separated from the back surface of the rear housing by the fixing member and the fastening member. With this configuration, for example, when a vibrating component, such as a speaker, is attached to the plate member, the generation of sound when the plate member and the rear housing come into contact with each other due to the vibration of the speaker attached to the plate member can be suppressed.

(3) In accordance with a preferred embodiment according to any one of the display device attachment structures mentioned above, the fixing member includes a planar permanent magnet or an adhesive sheet. With this configuration, the planar permanent magnet or the adhesive sheet can be used to attach the plate member to the rear housing, and thus the number of fastening holes to be newly provided in the rear housing can be reduced.

(4) In accordance with a preferred embodiment according to any one of the display device attachment structures mentioned above, the display device attachment structure further comprises a beam configured to be attached to the back surface of the rear housing to reinforce the rear housing, the beam being configured to protrude toward a rear side relative to the rear housing, the plate member being fixedly coupled to the beam by the fastening member. With this configuration, by attaching the plate member to the beam that protrudes toward the rear side, the plate member can be separated from the back surface of the rear housing by an amount that the beam protrudes toward the rear side.

(5) In accordance with a preferred embodiment according to any one of the display device attachment structures mentioned above, the beam extends along a longitudinal direction of the rear housing. With this configuration, the beam is large enough to sufficiently reinforce the display device.

(6) In accordance with a preferred embodiment according to any one of the display device attachment structures mentioned above, the plate member has a flat portion that is configured to be substantially parallel to the back surface of the rear housing and a protruding portion that is bent relative to the flat portion and protrudes toward the rear side along the beam.

(7) In accordance with a preferred embodiment according to any one of the display device attachment structures mentioned above, the plate member is configured to be fixed to the back surface of the rear housing by the planar permanent magnet or the adhesive sheet at the flat portion, and is fixed to the beam by a bolt as the fastening member at the protruding portion.

With this configuration, due to that the plate member comprises the protruding portion along the beam, the plate member can be securely fixed along the beam. In addition, due to that the plate member has the flat portion, it becomes easier to attach the plate member to the rear housing via the planar permanent magnet or the adhesive sheet.

(8) In accordance with a preferred embodiment according to any one of the display device attachment structures mentioned above, a surface of the plate member that faces the back surface of the rear housing is configured to be separated from the back surface of the rear housing by a thickness of the planar permanent magnet or the adhesive sheet. With this configuration, the spacing between the rear housing and the plate member can be adjusted by adjusting the thickness of the planar permanent magnet or the adhesive sheet.

(9) In accordance with a preferred embodiment according to any one of the display device attachment structures mentioned above, the fastening member is attached to one of an upper portion and a lower portion of the plate member, and the fixing member is attached to the other one of the upper portion and the lower portion of the plate member. With this configuration, the plate member can be fixed to the rear housing at two locations, the upper portion and the lower portion of the plate member, and thus the plate member can be stably fixed.

(10) In accordance with a preferred embodiment according to any one of the display device attachment structures mentioned above, the component includes a speaker. With this configuration, since the speaker is attached to the plate member, there is no need to provide a fastening hole for attaching the speaker to the rear housing. As a result, workability for attaching the speaker can be improved.

(11) In accordance with a preferred embodiment according to any one of the display device attachment structures mentioned above, the plate member further includes a cover member attachment portion to which a cover member for covering the back surface of the display device is configured to be fixed. With this configuration, the cover member can be attached to the rear housing without providing an attachment portion for attaching the cover member to the back surface of the rear housing.

(12) In accordance with a preferred embodiment according to any one of the display device attachment structures mentioned above, the plate member further includes a wall mount attachment portion to which a wall mount for mounting the display device on a wall is configured to be attached. With this configuration, the wall mount can be attached without providing a fastening hole for attaching the wall mount to the back surface of the rear housing.

(13) In view of the state of the known technology, a display device according to a second aspect of this disclosure comprises a display having a display surface on which an image is displayed, a rear housing attached to an opposite side of the display from the display surface, a cover member covering at least a part of the rear housing, and any one of the display device attachment structures mentioned above.

The display device according to the second aspect of this disclosure comprises the fixing member for fixing the plate member to the back surface of the rear housing. The fixing member is a different type of fastener than the fastening member, such as a non-fastening type fixing member for fixing the plate member to the back surface of the rear housing without using a fastening hole and a fastening member. With this configuration, the plate member can be attached to the rear housing by the non-fastening type fixing member without using a fastening hole and a fastening member, and thus the number of fastening holes to be newly provided in the rear housing can be reduced. As a result, workability for attaching the component can be improved.

In accordance with a preferred embodiment according to the display device above, the fixing member includes a planar permanent magnet or an adhesive sheet. With this configuration, the planar permanent magnet or the adhesive sheet can be used to attach the plate member to the rear housing, and thus the number of fastening holes to be newly provided in the rear housing can be reduced.

(14) In view of the state of the known technology, a display device attachment structure attaching method according to a third aspect of this disclosure comprises fixing a plate member to which a component of a display device is attached to a back surface of a rear housing opposite a display surface of the display device by a fixing member, and fixing the plate member to which the component of the display device is attached to the back surface of the rear housing by a fastening member via a fastening hole, the fixing member being a different type of fastener than the fastening member.

The display device attachment structure attaching method according to the third aspect of this disclosure comprises fixing the plate member to which the component of the display device is attached to the back surface of the rear housing opposite the display surface of the display device by the fixing member. The fixing member is a different type of fastener than the fastening member, such as a non-fastening type fixing member for fixing the plate member to the back surface of the rear housing without using a fastening hole and a fastening member. With this configuration, by fixing by the non-fastening type fixing member without using a fastening hole and a fastening member, the number of fastening holes to be newly provided in the rear housing can be reduced, and thus workability for attaching the component can be improved.

(15) In accordance with a preferred embodiment according to the display device attachment structure attaching method above, the fixing member includes a planar permanent magnet or an adhesive sheet. With this configuration, the planar permanent magnet or the adhesive sheet can be used to attach the plate member to the rear housing, and thus the number of fastening holes to be newly provided in the rear housing can be reduced.

(16) In accordance with a preferred embodiment according to any one of the display device attachment structures mentioned above, the fixing member is attached to the plate member for fixing the plate member to the back surface of the rear housing without using a fastening hole and a fastening member.

(17) In accordance with a preferred embodiment according to any one of the display device attachment structures mentioned above, the plate member includes an attachment hole through which the fastening member is disposed to be coupled to the fastening hole.

(18) In accordance with a preferred embodiment according to any one of the display device attachment structures mentioned above, the planar permanent magnet is attached to the plate member by an adhesive sheet.

(19) In accordance with a preferred embodiment according to any one of the display device attachment structures mentioned above, the plate member further includes a component attachment portion to which the component of the display device is configured to be attached.

(20) In accordance with a preferred embodiment according to any one of the display device attachment structures mentioned above, the fastening member includes a threaded fastener, and the fixing member is a different type of fastener than the threaded fastener.

According to the present disclosure, it is possible to provide a display device attachment structure, a display device, and a display device attachment structure attaching method, which can improve workability for attaching a component.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a display device in an upright position on a horizontal surface. Accordingly, these directional terms, as utilized to describe the display device should be interpreted relative to a display device in an upright position on a horizontal surface. The terms "left" and "right" are used to indicate the "right" when referencing from the right side as viewed from the front side of the display device, and the "left" when referencing from the left side as viewed from the front side of the display device.

The phrase "at least one of" as used in this disclosure means "one or more" of a desired choice. For one example, the phrase "at least one of" as used in this disclosure means "only one single choice" or "both of two choices" if the number of its choices is two. For another example, the phrase "at least one of" as used in this disclosure means "only one single choice" or "any combination of equal to or more than two choices" if the number of its choices is equal to or more than three. Also, the term "and/or" as used in this disclosure means "either one or both of".

The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A display device attachment structure, comprising:
a plate member configured to be attached to a rear housing of a display device and to which a component of the display device is configured to be attached;
a fastening member attached to the plate member for fixing the plate member to a back surface of the rear housing opposite a display surface of the display device via a fastening hole; and
a fixing member attached to the plate member for fixing the plate member to the back surface of the rear housing, the fixing member being a different type of fastener than the fastening member,
a surface of the plate member that faces the back surface of the rear housing being attached to the back surface of the rear housing in a state separated from the back surface of the rear housing by the fixing member and the fastening member.

2. The display device attachment structure according to claim 1, wherein
the fixing member includes a planar permanent magnet or an adhesive sheet.

3. The display device attachment structure according to claim 2, further comprising
a beam configured to be attached to the back surface of the rear housing to reinforce the rear housing, the beam being configured to protrude toward a rear side relative to the rear housing,
the plate member being fixedly coupled to the beam by the fastening member.

4. The display device attachment structure according to claim 3, wherein the beam extends along a longitudinal direction of the rear housing.

5. The display device attachment structure according to claim 3, wherein
the plate member has a flat portion that is configured to be substantially parallel to the back surface of the rear housing and a protruding portion that is bent relative to the flat portion and protrudes toward the rear side along the beam.

6. The display device attachment structure according to claim 5, wherein
the plate member is configured to be fixed to the back surface of the rear housing by the planar permanent magnet or the adhesive sheet at the flat portion, and is fixed to the beam by a bolt as the fastening member at the protruding portion.

7. The display device attachment structure according to claim 2, wherein
the surface of the plate member that faces the back surface of the rear housing is configured to be separated from the back surface of the rear housing by a thickness of the planar permanent magnet or the adhesive sheet.

8. The display device attachment structure according to claim 1, wherein
the fastening member is attached to one of an upper portion and a lower portion of the plate member, and the fixing member is attached to the other one of the upper portion and the lower portion of the plate member.

9. The display device attachment structure according to claim 1, wherein
the component includes a speaker.

10. The display device attachment structure according to claim 1, wherein
the plate member further includes a cover member attachment portion to which a cover member for covering the back surface of the display device is configured to be fixed.

11. The display device attachment structure according to claim 2, wherein
the plate member further includes a wall mount attachment portion to which a wall mount for mounting the display device on a wall is configured to be attached.

12. A display device, comprising
a display having a display surface on which an image is displayed;
a rear housing attached to an opposite side of the display from the display surface;
a cover member covering at least a part of the rear housing; and
the display device attachment structure according to claim 1.

13. The display device attachment structure according to claim 1, wherein
the fixing member is attached to the plate member for fixing the plate member to the back surface of the rear housing without using a fastening hole and a fastening member.

14. The display device attachment structure according to claim 1, wherein
the plate member further includes a component attachment portion to which the component of the display device is configured to be attached.

15. The display device attachment structure according to claim 1, wherein
the fastening member includes a threaded fastener, and
the fixing member is a different type of fastener than the threaded fastener.

16. A display device attachment structure attaching method, comprising
fixing a plate member to which a component of a display device is attached to a back surface of a rear housing opposite a display surface of the display device by a fixing member; and
fixing the plate member to which the component of the display device is attached to the back surface of the rear housing by a fastening member via a fastening hole,
the fixing member being a different type of fastener than the fastening members,
a surface of the plate member that faces the back surface of the rear housing being attached to the back surface of the rear housing in a state separated from the back surface of the rear housing by the fixing member and the fastening member.

17. The display device attachment structure attaching method according to claim 16, wherein
the fixing member includes a planar permanent magnet or an adhesive sheet.

18. A display device attachment structure, comprising:
a plate member configured to be attached to a rear housing of a display device and to which a component of the display device is configured to be attached;
a fastening member attached to the plate member for fixing the plate member to a back surface of the rear housing opposite a display surface of the display device via a fastening hole; and
a fixing member attached to the plate member for fixing the plate member to the back surface of the rear housing, the fixing member being a different type of fastener than the fastening member,
the plate member including an attachment hole through which the fastening member is disposed to be coupled to the fastening hole.

19. A display device attachment structure, comprising:
a plate member configured to be attached to a rear housing of a display device and to which a component of the display device is configured to be attached;
a fastening member attached to the plate member for fixing the plate member to a back surface of the rear housing opposite a display surface of the display device via a fastening hole; and
a fixing member attached to the plate member for fixing the plate member to the back surface of the rear housing, the fixing member being a different type of fastener than the fastening member,
the fixing member including a planar permanent magnet or an adhesive sheet, and
the planar permanent magnet being attached to the plate member by an adhesive sheet.

* * * * *